(12) United States Patent
Tamai et al.

(10) Patent No.: US 6,552,368 B2
(45) Date of Patent: Apr. 22, 2003

(54) LIGHT EMISSION DEVICE

(75) Inventors: Shingo Tamai, Kyoto (JP); Hayami Hosokawa, Kyoto (JP); Hironobu Kiyomoto, Kyoto (JP); Naru Yasuda, Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 09/967,845

(22) Filed: Sep. 28, 2001

(65) Prior Publication Data
US 2002/0084462 A1 Jul. 4, 2002

(30) Foreign Application Priority Data
Sep. 29, 2000 (JP) .......................... 2000-300430

(51) Int. Cl.[7] .......................................... H01L 29/227
(52) U.S. Cl. ............................ 257/98; 257/99; 257/100
(58) Field of Search .......................... 257/98, 100, 99; 362/800; 313/110, 512

(56) References Cited

U.S. PATENT DOCUMENTS

| | | | | |
|---|---|---|---|---|
| 2,861,165 A | * | 11/1958 | Algrain et al. | 257/98 |
| 3,821,775 A | * | 6/1974 | Biard | 357/17 |
| 4,698,730 A | * | 10/1987 | Sakai et al. | 362/311 |
| 5,093,768 A | * | 3/1992 | Ohe | 362/241 |
| 5,898,267 A | * | 4/1999 | McDermott | 313/512 |

* cited by examiner

*Primary Examiner*—Sara Crane
(74) *Attorney, Agent, or Firm*—Rosenthal & Osha L.L.P.

(57) ABSTRACT

A light emission device includes a light emitter, a light reflection member, and a resin sealing the light emitter by covering the light reflection member and the light emitter, in which light deviated from a predetermined front region in the light emitted from the light emitter is totally reflected by a boundary surface of the resin to be forwardly emitted by the light reflection member, and the emitter is thermally contacted with the reflection member to dissipate the heat generated from the light emitter.

9 Claims, 18 Drawing Sheets

(A)

(B)

LIGHT EMISSION DEVICE

BACKGROUND OF INVENTION

This invention generally relates to a field of light emission device.

In FIG. 30, there is shown a conventional light emission device of a cannonball shape in which a chip of a light emitter (hereinafter called "light emitter") 1 such as a light emitting diode (LED) or a semiconductor laser (LD) is mounted to be die-bonded on a lead frame 2, and electrically connected with another lead frame 3 by a bonding wire 4 to be sealed by a resin mold 6.

The conventional light emission device, however, is not considered about any heat dissipation structure other than the narrow lead frame 2 in order to radiate heat generated from the light emitter, thereby reducing the maximum rating current applied to the device due to damage by heat. Accordingly, as a larger current than the maximum rating current is applied for a long time period, a junction portion of the light emitter rises to a high temperature, thereby inviting characteristic deterioration or disconnection fault to decrease the reliability of the light emitter.

Depressing the maximum rating current causes a decrease in the quantity of light emission, whereby a large number of light emission devices must be employed to obtain a large quantity of light emission, which is uneconomical.

SUMMARY OF INVENTION

It is, therefore, a primary object of this invention to provide a light emission device having an improved heat dissipation performance in which the applicable maximum rating current is enlarged to emit light brightly, and characteristic deterioration by overheat of a light emitter or disconnection fault is prevented so as to improve the reliability of the light emitter.

It is another object of this invention to provide a light emission device array having excellent heat dissipation characteristics.

It is still another object of this invention to provide a light emission device having excellent heat dissipation characteristics in which a light emitter is of a surface mount type.

According to this invention, there is provided a light emission device including a light emitter and a light reflection member to emit light from the light emitter as generally parallel light from a front wall of the device, in which the light reflection member serves as a cooling plate to improve the heat dissipation performance.

According to a first aspect of this invention, there is provided a light emission device including a light emitter, a light reflection member and a resin sealing the light emitter by covering the light reflection member and the light emitter, in which light deviated from a predetermined front region in the light emitted from the light emitter is totally reflected by a boundary surface of the resin to be forwardly emitted by the light reflection member, and the light emitter is thermally contacted with the light reflection member to dissipate the heat generated from the light emitter.

The light reflection member serves as a heat dissipating plate by thermally contacting the light emitter with the light reflection member to increase the applicable maximum rating current by increasing the heat dissipation performance for bright light emission, thereby increasing the reliability of the light emitter by preventing characteristic deterioration by overheat of the light emitter or disconnection fault. The light emitter may be mounted on a lead frame electrically connected with the light emitter, which is thermally contacted with the light reflection member.

In order to improve the radiation characteristics, it is desirable to expose non-reflection surface of the light reflection member to air directly or through a thinned resin layer or cover a partial or whole surface of the resin by a peripheral edge of the light reflection member.

According to a second aspect of this invention, there is provided a light emission device including a light emitter, a light reflection member, a resin sealing the light emitter by covering the light reflection member and the light emitter, and a vertical plane body having good thermal conductivity, in which the light emitter is mounted on the vertical plane body and the vertical plane body is thermally connected with the light reflection member to dissipate heat of the light emitter through the vertical plane body and the light reflection member.

The vertical plane body is configured to have a dish portion on a center of the vertical plane body to be mounted by the light emitter, a groove for accommodating an insulator holding a lead frame, and a groove making the lead frame extending therethrough for easy assembling.

According to a third aspect of this invention, there is provided a light emission device including a light emitter mounted on a lead frame, a light reflection member, and a resin sealing the light emitter by covering the light reflection member and the light emitter, in which the light reflection member is formed with the lead frame as a single unit, thereby dissipating heat of the light emitter mounted on the lead frame through the light reflection member.

According to the second or third aspect of this invention, the lead frame or the vertical plane body having a good thermal conductivity is thermally contacted with the light reflection member, or the light reflection member is formed with the lead frame mounted by the light emitter as a single unit, thereby easily and firmly conveying the heat of the light emitter to the light reflection member for dissipation to increase the applicable maximum rating current for bright light emission and to further increase the reliability of the light emitter by preventing characteristic deterioration by overheat of the light emitter or disconnection fault.

According to a fourth aspect of this invention, there is provided a light emission device including a plurality of light reflection portions formed on a metal member in an array fashion, a plurality of light emitters each mounted near a center of each of the light reflection portions to be die-bonded, a wiring pattern disposed on a surface of the metal member through an insulation film to be connected with each of the light emitters, and a resin covering the light emitters above the light reflection portions, in which the resin is formed to direct light deviating from a predetermined front region about the light emitted from each of the light emitters to be substantially reflected at a boundary surface of the resin for forward emission by each of the light reflection portions, and heat generated from each of the light emitters is dissipated by the metal member.

Thus, a heat dissipation effect is provided by the metal member, thereby increasing the maximum rating current which can be applied to the light emitters for bright light emission, preventing a characteristic deterioration or any disconnection fault by overheat of the light emitters, whereby light emission device array having a high reliability may be provided.

According to a fifth aspect of this invention, there is provided a light emission device including an optical member having a light reflection member and a resin covering the light reflection member, and a light emitter of a surface mount type mounted on a metal plate, in which the resin is so constructed to direct light deviating from a predetermined front region about the light emitted from the light emitter to be substantially reflected at a boundary surface of the resin for forward emission by the light reflection member, and the light reflection member is thermally contacted with the metal plate to dissipate heat generated by the light emitter.

Thus, heat dissipation characteristics can be improved in the surface mount type light emission device, thereby increasing the maximum rating current which can be applied to the light emitter for bright light emission, preventing a characteristic deterioration or any disconnection fault by overheat of the light emitter, whereby the light emission device of the surface mount type having a high reliability may be provided.

Other objectives and advantages of this invention will be more readily apparent from the following detailed description provided in conjunction with the following figures.

DETAILED DESCRIPTION

Figure 1:
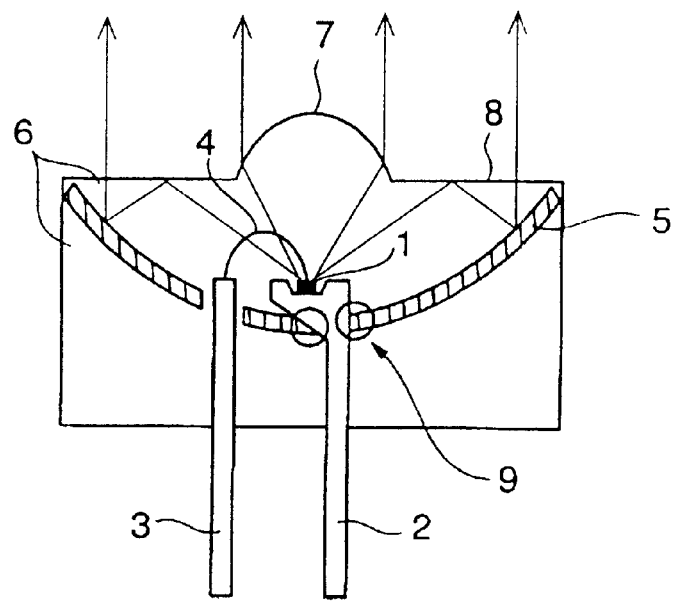
FIG. 1 shows a schematic sectional section view of a light emission device according to a first embodiment of this invention.

Referring, now, to FIG. 1, there is shown a schematic sectional view of a light emission device according to a first embodiment of this invention. This light emission device includes a light emitter 1 such as a light emitting diode (LED), a semiconductor laser (LD) or the like, a first lead frame 2 on a saucer portion of which the light emitter 1 is die-bonded, second lead frame 3, a bonding wire 4 connecting the second lead frame 3 with the light emitter 1, and a light reflection member 15 formed of metal. These parts are sealed by a transparent mold resin 6.

The resin mold 6 at a center of a light emission side thereof includes a direct emission region 7 forming a convex lens having a spherical lens-shape, an aspherical lens shape, or a paraboloid shape, and the light emitter 1 is located in a focal point of the direct emission region 7 or its neighborhood. Accordingly, light emitted from the light emitter 1 and directed to the direct emission region 17 is directly emitted approximately parallel from a front wall of the mold resin 6 forwardly.

A planar total reflection region 8 is formed such that the planar total reflection region surrounds the direct emission region 7. An angle viewed from the light emitter 1 which is made by an optical axis of the light emitter 1 and a direction to a border between regions 7 and 8 is designed to be not less than the critical angle of total reflection between mold resin 6 and air. Therefore, in the light emitted from light emitter 1, light directed to the total reflection region 8 is substantially reflected with a boundary surface of mold resin 6, and further reflected by light reflection member 5 to be emitted forwardly from the total reflection region 8. The total reflection region, therefore, may also be considered as having total internal reflection, as that term is defined in physics.

The lead frame 2 mounted by light emitter 1 at a circle-marked portion 9 is thermally connected with the light reflection member 5 by a mechanical connection such as thermal conduction nature adhesives, soldering, silver soldering, ultra sonic wave welding, and calking. Other lead frame 3 is sealed so as not to come into contact with light reflection member 5. Therefore, the heat produced by light emission of the light emitter 1 is spread by the light reflection member 5 made of metal through the lead frame 2 to be lowered, and the large area of light reflection member 5 scatters the heat to improve its cooling effect. Thus, characteristic deterioration and disconnection fault by heat of the light emitter 1 is prevented, thereby improving reliability of light emitter 1 and increasing the absolute maximum rating current to illuminate the light emitter brighter.

Figure 2:
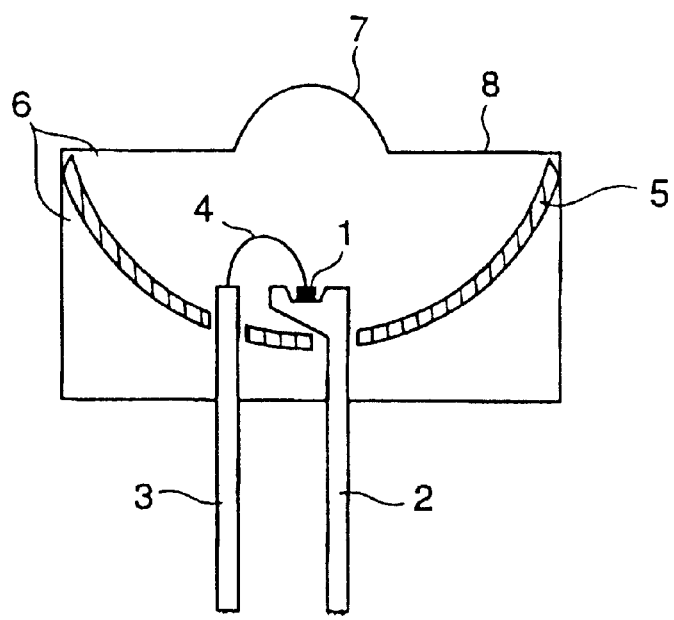
FIG. 2 shows schematic sectional side view of a light emission device according to a second embodiment of this invention.

FIG. 2 shows a schematic sectional side view of a light emission device according to a second embodiment of this invention. Components shown in FIG. 2 which are identical to components shown in FIG. 1 are identified by the same reference numerals. Thus, components in the following embodiments which are identical to components shown in FIG. 1 are identified by the same reference numerals, an explanation of the identical components will not be repeated.

Referring to FIG. 2, the lead frame 2 is not directly contacted with light reflection member 5, but is located proximate to the light reflection member 5 to be sealed by resin mold 6 for thermal connection through which the heat of lead frame 2 is transferred to light reflection member 5. Thus, the production process described with reference to FIG. 1 above, for joining lead frame 2 with light reflection member 5 can be omitted, while same dissipation effect as that of the first embodiment can be ensured by obtaining thermal contact by resin mold 6 having good thermal conductivity sealing lead frame 2 and light reflection member 5 which approach each other.

Figure 3:
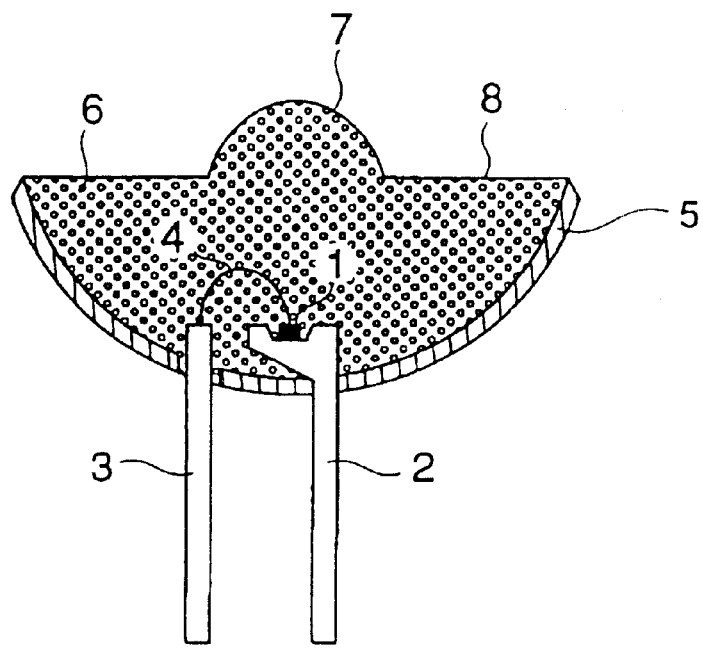
FIG. 3 shows a schematic sectional side view of a light emission device according to a third embodiment of this invention.

FIG. 3 shows a schematic sectional side view of a light emission device according to a third embodiment of this invention. Both a reflection side and a rear side of the light reflection member 5 are sealed by the mold resin 6 as in the light emission devices of FIGS. 1 and 2. Though the mold resin 6 has good thermal conductivity, the heat conveyed to light reflection member 5 is spread to air through the mold resin 6, whereby its heat dissipation effect is deteriorated in comparison with the case where the heat is directly spread from the light reflection member 5. Accordingly, in the light emission device of FIG. 3 according to this third embodiment, a side of light reflection member 5 proximate to light emitter 1 is sealed by mold resin 6, but an opposite side thereof is not coated by any material or, if desired, coated with a thinned resin having a thickness of 1 mm or less. Thus, the heat conveyed to light reflection member 5 from light emitter 1 through lead frame 2 is efficiently dissipated by light reflection member 5 contacting external air directly or through the very thinned coating layer to further improve the cooling effect. The lead frame 2 and the light reflection member 5 may be sealed by contacting each other like the light emission device of FIG. 1 or approaching each other without any contact like the light emission device of FIG. 2. This can be applied to the following embodiments described hereinafter.

Figure 4:
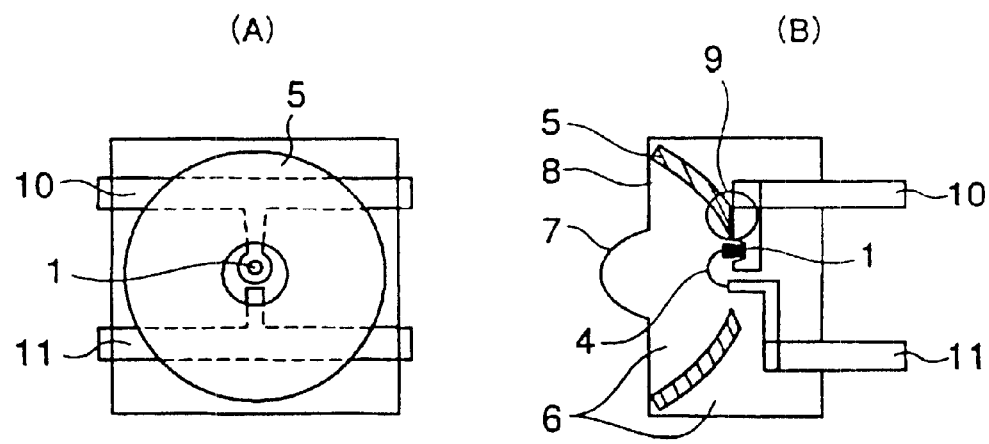
FIG. 4 at (A) shows a top plan view of a light emission device according to a fourth embodiment of this invention, and FIG. 4 at (B) shows a sectional side view of the device.

FIG. 4 at (A) shows a top plan view of a light emission device according to a fourth embodiment of this invention, and FIG. 4 at (B) shows a sectional side view of the device. In the first embodiment, the lead frames 2 and 3 serve as lead wires for electrical contact with the light emitter 1, but the lead frames of FIG. 4 provide heat dissipation effect. The light emission device of FIG. 4 includes lead frame 10 die-bonded by light emitter 1 similar to lead frame 2 of FIG. 1 and lead frame 11. The lead frames 10 and 11 are formed to have more than three edges of the lead frames protruding from resin mold 6. Thus, the heat from light emitter 1 is spread not only through light reflection member 5, but also through lead frame 10 to be dissipated in air. The heat reaching mold resin 6 from light reflection member 5 is also dissipated through lead frame 11, thereby providing a cooling effect.

Figure 5:
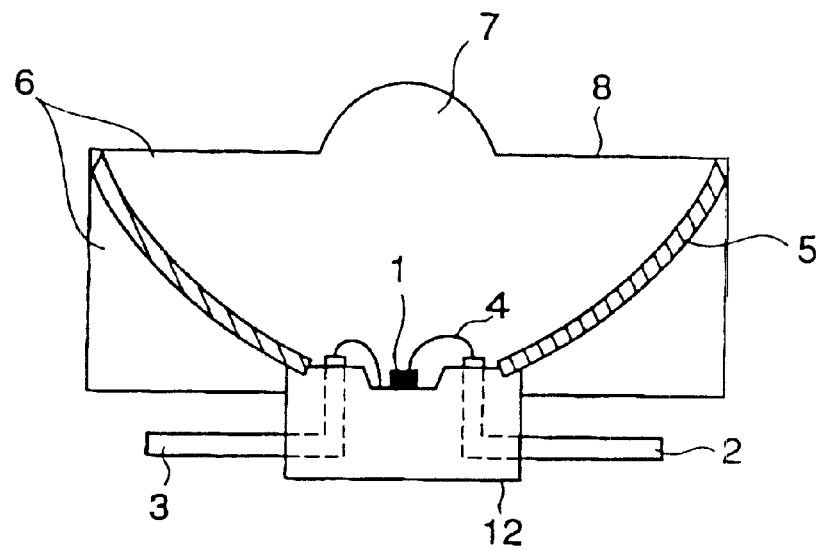
FIG. 5 shows schematic sectional side view of a light emission device according to a fifth embodiment of this invention.

FIG. 5 shows a schematic sectional side view of a light emission device according to a fifth embodiment of this invention. In the above-mentioned embodiments of FIGS. 1 to 4, the light emitter 1 may be die-bonded on the lead frame 2 or 10 at saucer thereof, and the heat from the light emitter 1 is radiated by lead frames through the light reflection member 5.

The light emission device of FIG. 5 includes a metal base 12 having a vertical plane body which is die-bonded by light emitter 1 and pierced by lead frames 2 and 3 electrically insulated from the base. A light reflection member 5 is joined with the base 12 so that the thermal conductivity may become high. Therefore, the heat from light emitter 1 reaches the base 12 and the light reflection member 5 to be spread therethrough, thereby providing an additional cooling effect.

Figure 6:
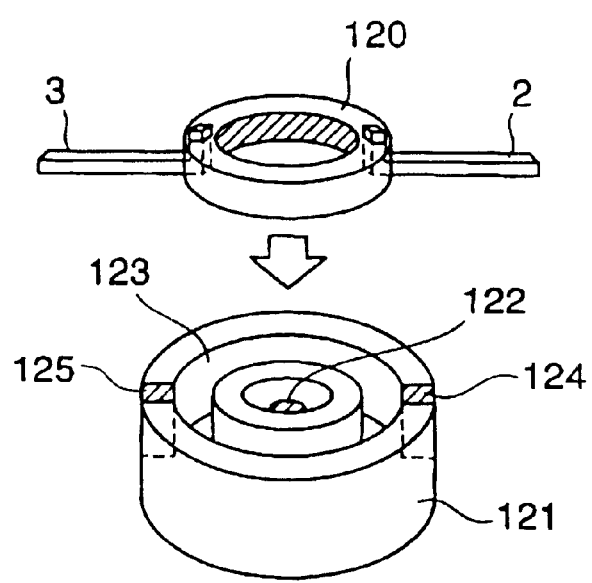
FIG. 6 shows an example of configuration of a base employed in the device of FIG. 5.

FIG. 6 shows an example of configuration of the base 12 of FIG. 5, which includes an insulation member 120 holding lead frames 2 and 3, and a pedestal 121 for die-bonding a light emitter 1 thereon. The pedestal 121 is provided with a plate-shaped saucer part 122 for putting light emitter 1 thereon, a groove 123 installed by the insulation member 120, and grooves 124 and 125 inserted by lead frames 2 and 3, whereby the insulation member 120 is engaged with the grooves 123, 124 and 125.

Figure 7:
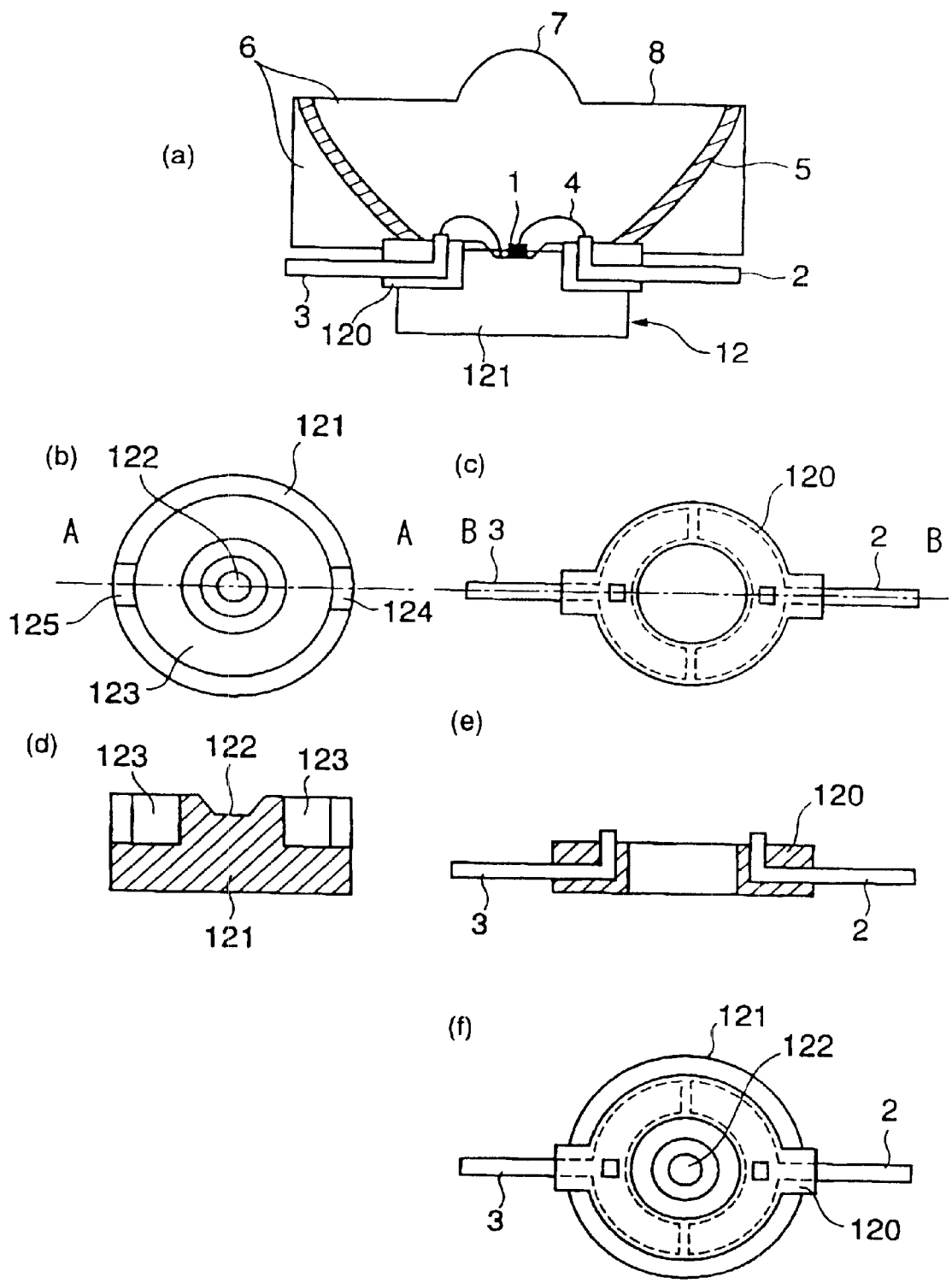
FIG. 7 shows another example of configuration of a base employed in the device of FIG. 5.

FIG. 7 shows another example of the configuration of base 12 of the fifth embodiment. FIG. 7 shows at (a) a side sectional view of a modified light emission device of the fifth embodiment shown in FIG. 5, at (b) a top plan view of a pedestal 121, at (c) a top plan view of an insulation member 120, at (d) a sectional view taken along one-dotted line A—A of FIG. 7 at (b), at (e) a sectional view taken along one-dotted line B—B of FIG. 7 at (c), and at (f) a top plan view of the insulation member 120 crowded with the pedestal 121. The pedestal 121 of FIG. 7 is the same as that of FIG. 6. Within the insulation member 120 there are disposed lead frames 2 and 3 in a semicircular-shape as indicated in dotted lines which are provided with projections at extending from the insulation member so as not to come into contact with the pedestal 121, thereby reinforcing insulation member 120 and lead frames 2 and 3.

The pedestal 121 of FIG. 6 employs a cylindrical configuration, but may be modified to employ another vertical plane body configuration such as a square pole, a triangle pole, and a circular cone as long as it has good thermal conductivity. The light reflection member 5 and the pedestal 12 are mechanically joined by the above-described thermally conductive adhesive, soldering, silver-soldering, ultrasonic wave welding, calking, or the like.

Figure 8:
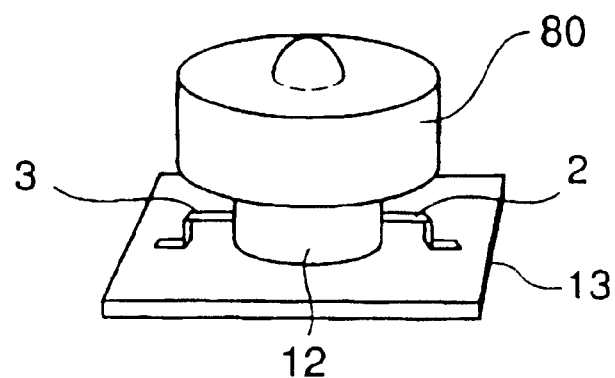
FIG. 8 shows a perspective view of a light emission device as a sixth embodiment of this invention.

FIG. 8 shows a perspective view of a light emission device 80 according to a sixth embodiment of this invention, in which the light emission device of the fifth embodiment of FIG. 5 has metal base 12 joined with a heat dissipating plate 13 made of metal. This join employs the above-described thermally conductive adhesive, soldering, silver-soldering, ultrasonic wave welding, calking, or the like.

Figure 9:
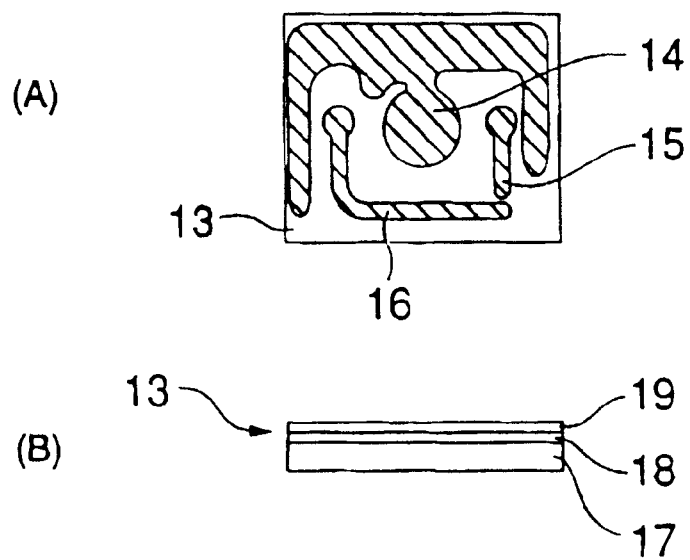
FIG. 9 shows an example of a heat dissipating plate employed in the device of FIG. 8.

FIG. 9 shows one example of the heat dissipating plate 13 of FIG. 8, at (A) a top plan view of the plate, and at (B) a side sectional view of the same. As shown in FIG. 9 at (B), the heat dissipating plate 13 is composed of a first layer land 17 made of metal having a high thermal conductivity such as aluminum, copper or the like, a second layer land 18 consisting of a thin resin layer having high insulation such as glass epoxy, and a third layer land 19 having a land 14 for the base, lands 15 and 16 for lead frames as shown in FIG. 9 at (A), to be connected with the base 12 and the lead frames 2 and 3 of FIG. 5.

Thus, in addition to the heat radiation effect by the base 12 as in FIG. 5 described above, there may be obtained the heat radiation effect by the first layer land 17 through the second layer land 18 having the thinned layer of glass epoxy from the land 14 for the base, thereby improving the heat radiation performance.

Figure 10:
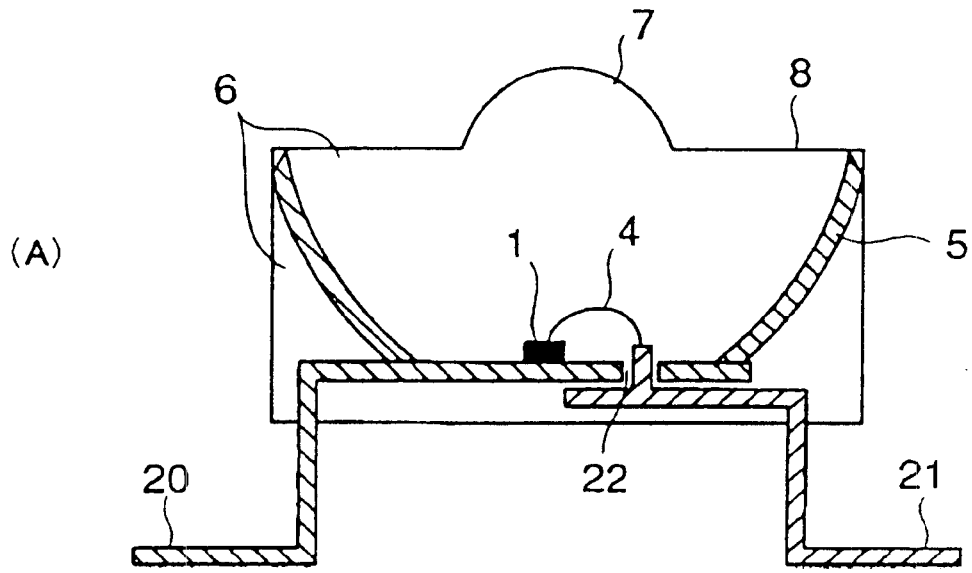
FIG. 10 at (A) shows a side sectional view of a light emission device as a seventh embodiment of this invention.
Figure 10:
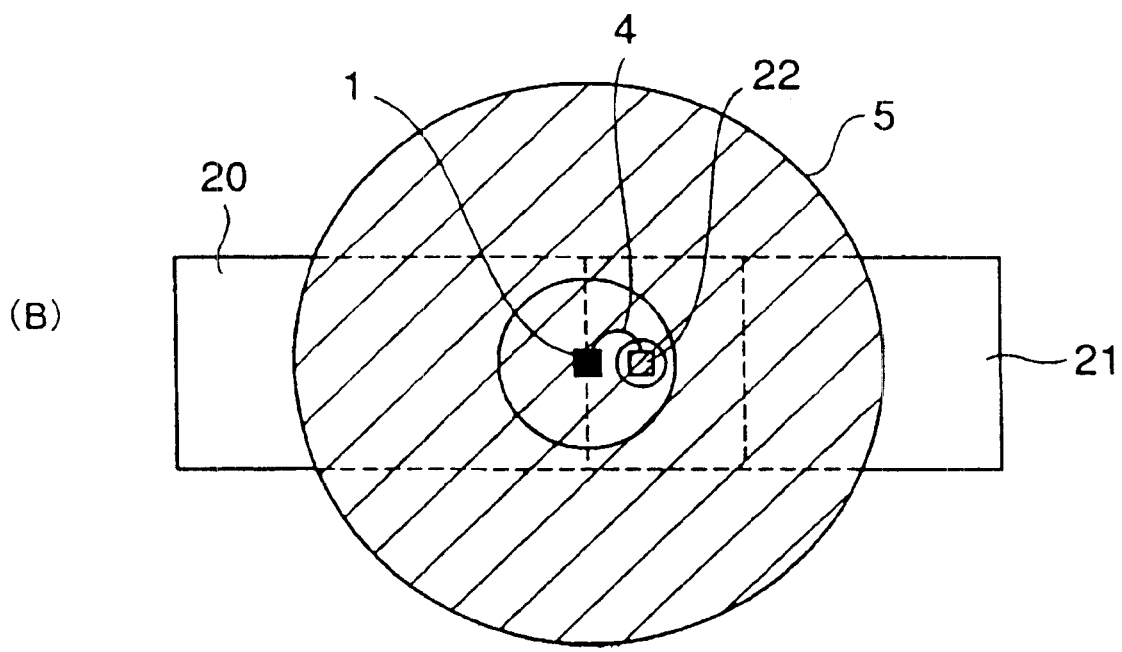

FIG. 10 at (A) shows a side sectional view of a light emission device as a seventh embodiment of this invention, and at (B) a top plan view of the device. As shown in FIG. 10 in this seventh embodiment, a first lead frame 20 die-bonded by light emitter 1 comprises a plate member having an area of the dimension which can approximately block at least a part of inside diameter of light reflection member 5 and connected with the light reflection member 5. The lead frame 20 is further provided with an opening 22 pierced by a projection of a second lead frame 21 having a same width as that of the first lead frame 20, and the projection is connected with a wire bonding 4.

Accordingly, in this seventh embodiment, the heat produced from the light emitter 1 is spread and radiated by lead frame 20 having heat dissipation function, and lead frame 21 through light reflection member 5 and mold resin 6, thereby greatly improving heat radiation performance. The shape of the opening 22 pierced by the projection of the lead frame 21 is round, but may be modified to other shape such as quadrangle or other polygon.

Figure 11:
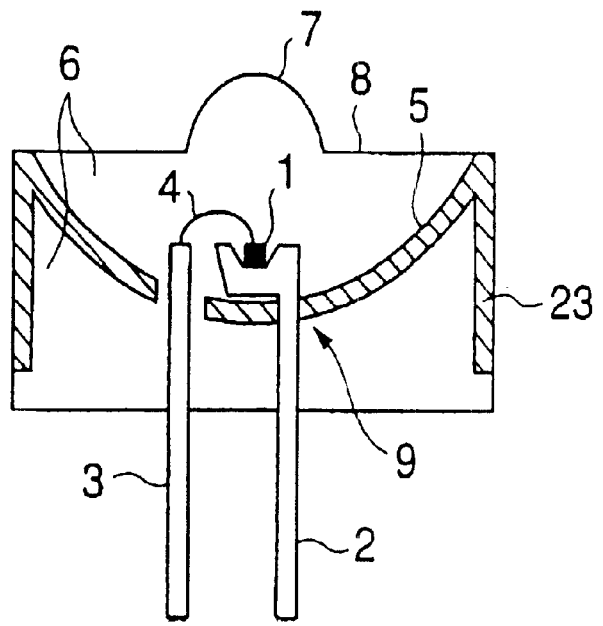
FIG. 11 shows a sectional view of a light emission device according to an eighth embodiment of this invention.

FIG. 11 shows a sectional view of a light emission device according to an eighth embodiment of this invention. Light reflection member 5 has a portion 23 extending from an outside diameter thereof to cover a surface of mold resin 6 opposite to light emitter 1, whereby the portion 23 is directly exposed to external air, the radiation performance is improved and the strength of the light emission device itself is also improved.

Figure 12:
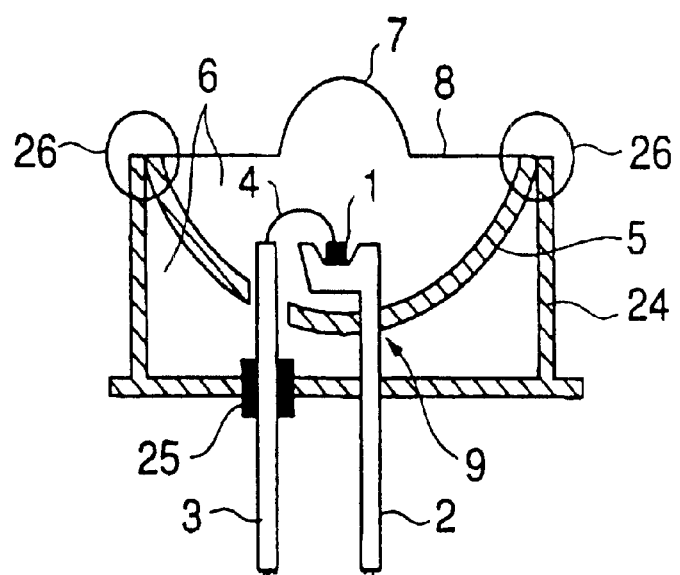
FIG. 12 shows a sectional view of a light emission device according to a ninth embodiment of this invention.

FIG. 12 shows a sectional view of a light emission device according to a ninth embodiment of this invention. A metal package 24 is formed so as to cover a surface of a mold resin 6 other than a light emission surface thereof, and connected with a light reflection member 5 at connecting portions 26. The metal package 24 at a portion pierced by a lead frame 3 is further provided with an insulation member 25. The connecting portions 26 employ the above-described thermally conductive adhesive, soldering, silver-soldering, ultrasonic wave welding, calking, or the like.

According to this embodiment, the portion directly exposed to air is larger than the device of FIG. 11, thereby improving the heat radiation performance and the strength of the light emission device itself. The light reflection member 5 and the metal package 24 are separate members to be joined each other in this embodiment, but, if desired, may be formed as a single unit.

Figure 13:
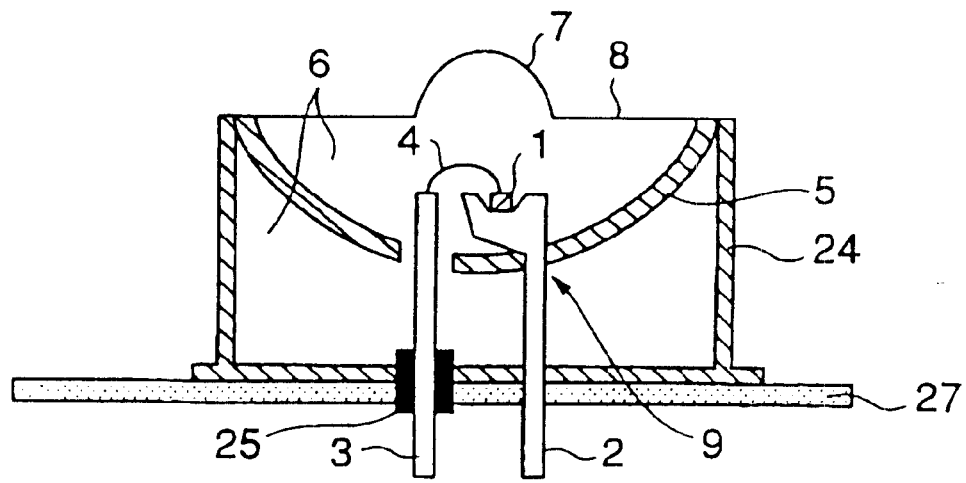
FIG. 13 shows a sectional view of a light emission device according to a tenth embodiment of this invention.

FIG. 13 shows a sectional view of a light emission device according to a tenth embodiment of this invention, wherein a heat radiation plate 27 is employed to be contacted with the metal package 24 of the light emission device of FIG. 12. Thus, the heat produced from the light emitter 1 is radiated in air through lead frame 2, light reflection member 5, metal package 24, and heat radiation plate 27, thereby further improving the heat radiation performance. The heat radiation plate 27 and the metal package 24 in connection may be modified to be joined each other by the above-mentioned adhesive method, if desired.

Figure 14:
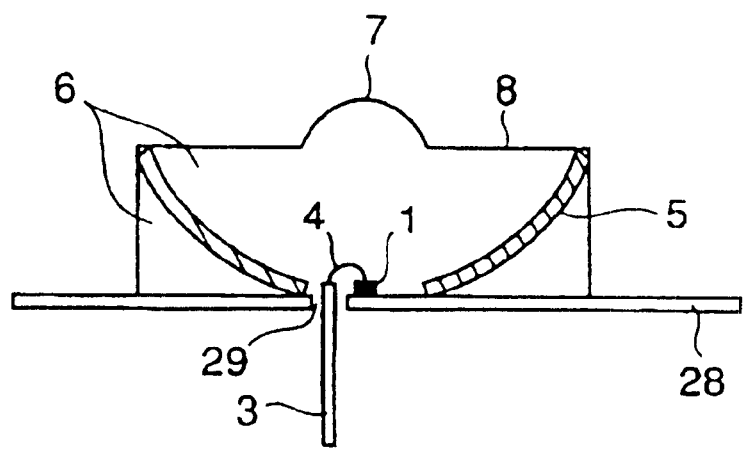
FIG. 14 shows a sectional view of a light emission device according to an eleventh embodiment of this invention.

FIG. 14 shows a sectional view of a light emission device according to an eleventh embodiment of this invention, wherein a light emitter 1 is die-bonded on a metal plate 28 serving as a lead frame, and the metal plate 28 is provided with a hole 29 to be pierced by another pole lead frame 3. Thus, the metal plate 28 is directly exposed to air, so that the heat of the light emitter 1 is radiated into air from the metal plate 28, thereby providing high heat radiation performance. The shape of the opening hole 29 pierced by lead frame 3 may be round, quadrangle or other polygon.

Figure 15:
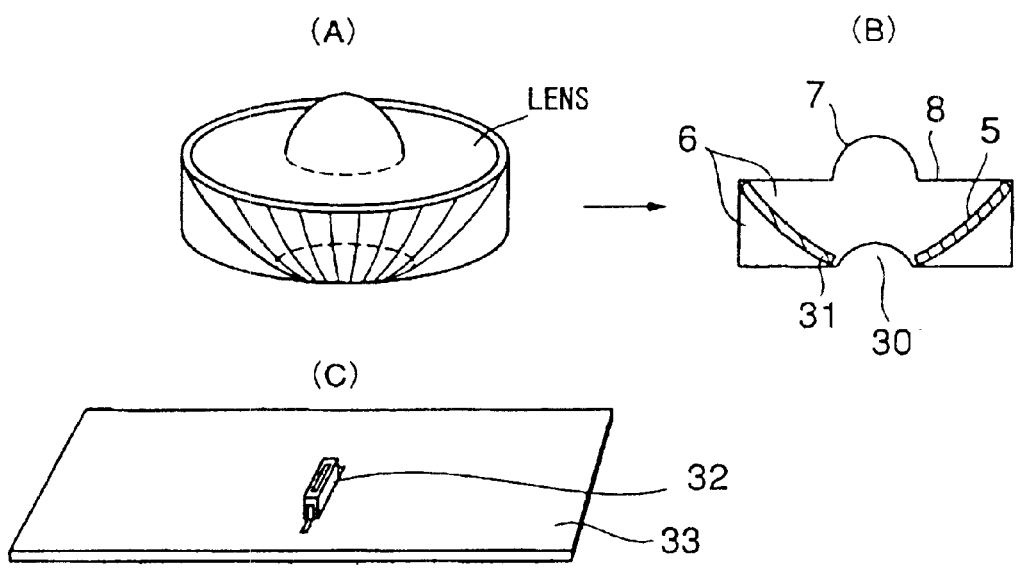
FIG. 15 shows a sectional view of a light emission device according to a twelfth embodiment of this invention.

FIG. 15 shows a sectional view of a light emission device according to a twelfth embodiment of this invention. FIG. 15 at (A) shows a perspective view of a lens unit and at (B) shows a side sectional view of the lens unit to be mounted on a light emitter 32 of a surface mount type mounted on a metal plate 33 shown in FIG. 15 at (C), thereby providing the light emission device of this embodiment. The lens unit includes a light reflection member 5, a mold resin 6, a direct emission region 7 and a total reflection region 8, and is provided with a concave portion 30 for accommodating the light emitter 32. The light emitter 1, the lead frames 2 and 3 and the bonding wire 4 shown in FIG. 1 are omitted, and the light reflection member 5 is externally exposed at a portion 31 to be joined with the metal plate 33 by the above-mentioned method.

According to thus constructed light emission device, the employment of the light emitter of surface mount type may provide same effect as that of the device of FIG. 14, and emit approximately parallel light emitted from the surface mount type light emitter.

Figure 16:
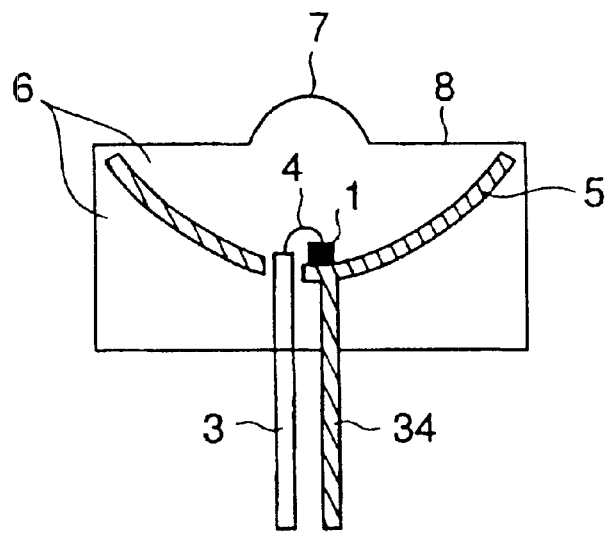
FIG. 16 shows a sectional view of a light emission device according to a thirteenth embodiment of this invention.

FIG. 16 shows a sectional view of a light emission device according to a thirteenth embodiment of this invention, which includes a light reflection member 5 and a mold resin 6. The light reflection member 5 is formed to be directly die-bonded by a light emitter 1 and provide a lead frame 34 as a single unit. Other components are similar to those of the device of FIG. 1. Thus, the heat from the light emitter 1 is spread over the light reflection member 5 to decrease the temperature and radiated with wide area to greatly improve cooling effect, whereby the characteristic deterioration and disconnection fault by the heat of light emitter 1 is prevented so as to enable enhancement of the reliability and the absolute maximum rating current applied to the light emitter 1, thereby enabling the light emitter 1 to increase the brightness.

Figure 17:
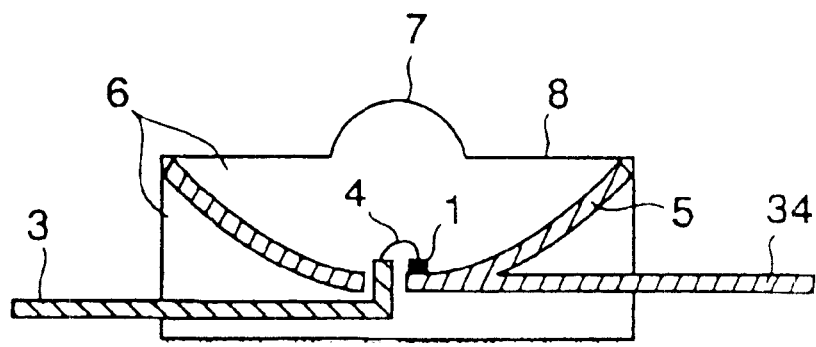
FIG. 17 shows a sectional view of a light emission device according to fourteenth embodiment of this invention.

FIG. 17 shows a sectional view of a light emission device according to fourteenth embodiment of this invention, which is modified from the device of FIG. 16 by protruding lead frames 3 and 34 outwardly in a direction crossing an optical axis of the light emitter 1 by right angle. Therefore, in addition to the effect in the thirteenth embodiment that the heat from the light emitter 1 is spread over light reflection member 5 to decrease the temperature and improve the cooling effect by radiating with the wide area, there may be obtained advantageous compactness of spacing in mounting.

Figure 18:
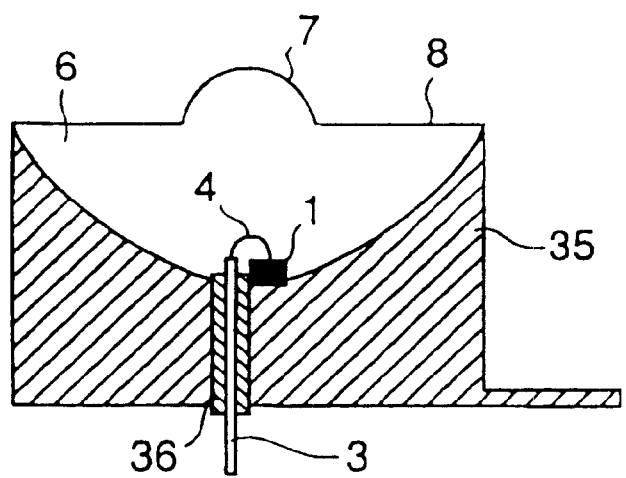
FIG. 18 shows a sectional view of a light emission device according to a fifteenth embodiment of this invention.

FIG. 18 shows a sectional view of a light emission device according to a fifteenth embodiment of this invention, in which there is disposed a metal member 35 of a cylindrical configuration providing a reflection surface by digging out one end of the metal member 35. A light emitter 1 is die-bonded on the reflection surface of the metal member 35, and a lead frame is protruded from a bottom end of the metal member 35 as a single unit. The metal member 35 is further provided with a hole inserted by an insulation member 36 pierced by another lead frame 3. According to this construction, the heat from the light emitter 1 is spread through the metal member 35 of the cylindrical shape having a large volume and a large heat capacity, thereby efficiently radiating the heat. The vertical plane body of the metal member 35 is cylindrical configuration, but may be other configuration such as circular cone, elliptic cylinder, multi-angular post or the like.

Figure 19:
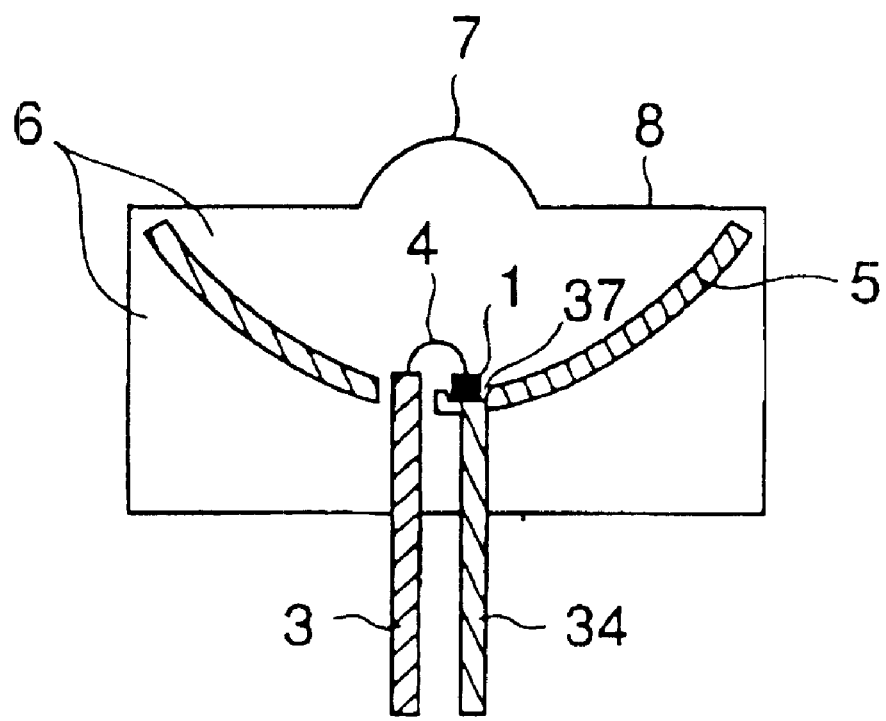
FIG. 19 shows a sectional view of a light emission device according to a sixteenth embodiment of this invention.

FIG. 19 shows a sectional view of a light emission device according to a sixteenth embodiment of this invention, in which the thirteenth embodiment of FIG. 16 is modified by disposing a saucer portion 37 of a concave shape at a location of a light reflection member 5 to be mounted by a light emitter 1. In addition to the advantages of the thirteenth embodiment, this embodiment may provide such advantages that light emitted from the light emitter 1 can be effectively condensed in the optical axis direction to increase the quantity of light in the optical axis direction. The modification of this embodiment may be applied to the seventh and eleventh embodiments shown in FIGS. 10 and 14, respectively. A saucer portion to be mounted by the light emitter 1 may be disposed on the lead frame 20 in the seventh embodiment of FIG. 10 and the metal plate 28 in the eleventh embodiment of FIG. 14 respectively, thereby providing same advantages as those of this sixteenth embodiment.

Figure 20:
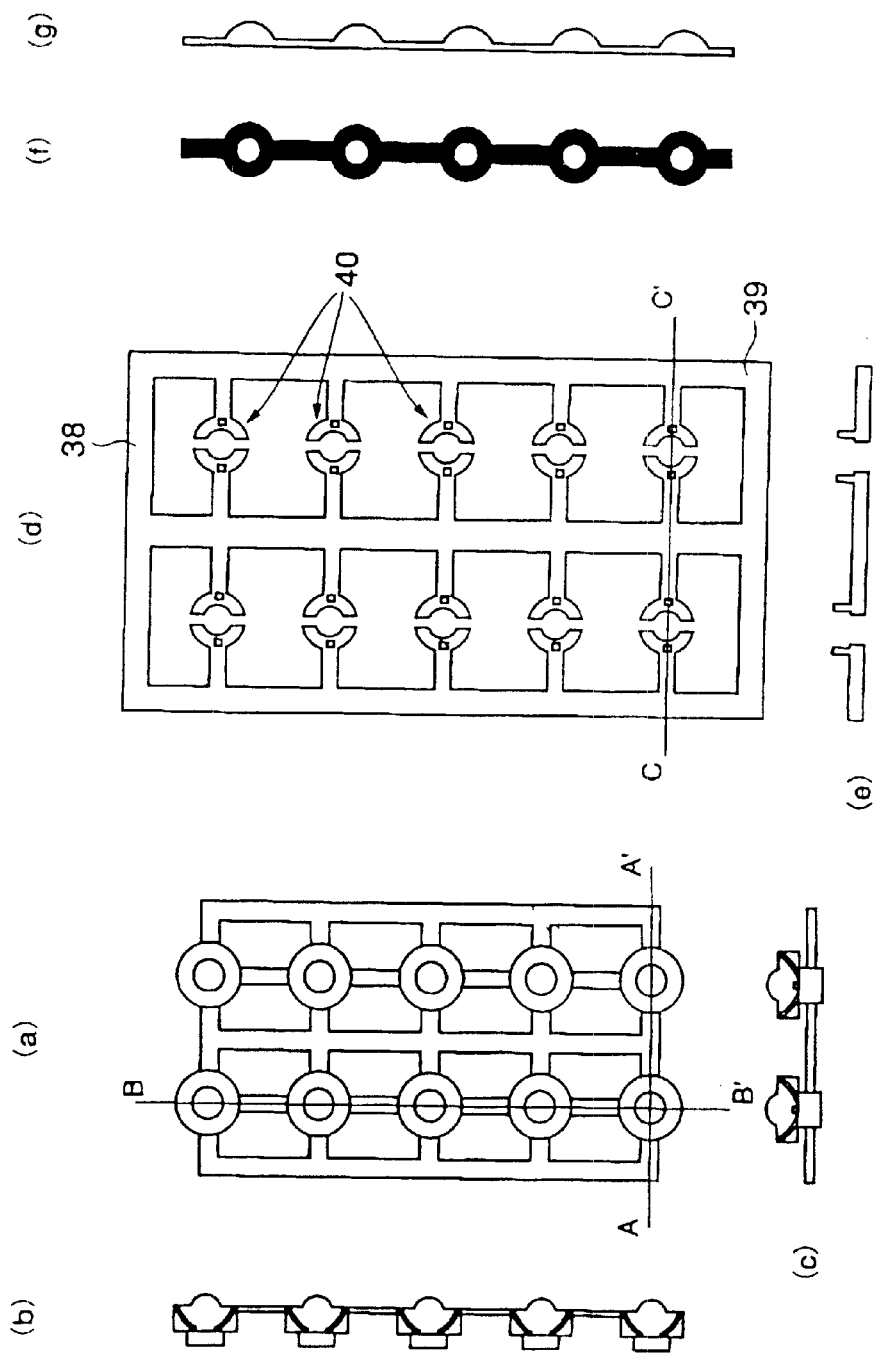
FIG. 20 at (a) shows a top plan view of a light emission device array according to a seventeenth embodiment of this invention.

FIG. 20 at (a) shows a top plan view of a light emission device array according to a seventeenth embodiment of this invention, in which a plurality of the light emission devices of the fifth embodiment shown in FIGS. 5 to 7 are arranged in an array fashion. FIG. 20 shows at (b) a sectional view of the device taken along the line B–B' at (a), at (c) a sectional view of the device taken along the line A–A' at (b), at (d) a lead frame array providing lead frames 2 or 3 in FIG. 6 or 7, at (e) a sectional view of the lead frame array taken along the line C–C' at (d), at (f) a light reflection member array, and at (g) a sectional side view of the same.

In this embodiment, at first, the insulation member 120 holding the lead frame shown in FIGS. 6 and 7 is disposed on each lead frame 40 of the lead frame array shown in FIG. 20 at (d). Next, the pedestal 121 shown in FIGS. 6 and 7 is embedded on each insulation member 120 to die-bond light emitter 1. Moreover, lead frame, light emitter 1 and pedestal 121 are respectively connected by bonding wire as shown in FIGS. 6 and 7 to be overlaid by the light reflection member array shown in FIG. 20 at (f) for joining each light reflection member to each pedestal 121. Mold resin 6 is disposed to seal the light emitter 1 with forming direct emission region 7 and total reflection region 8, thereby providing the light emission device array of this embodiment.

Figure 21:
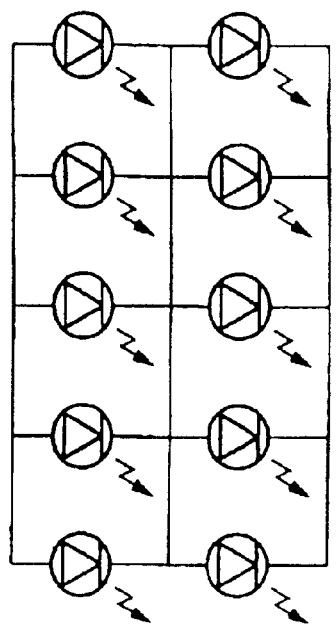
FIG. 21 shows a circuit diagram provided by the light emission device array of FIG. 20.
Figure 22:
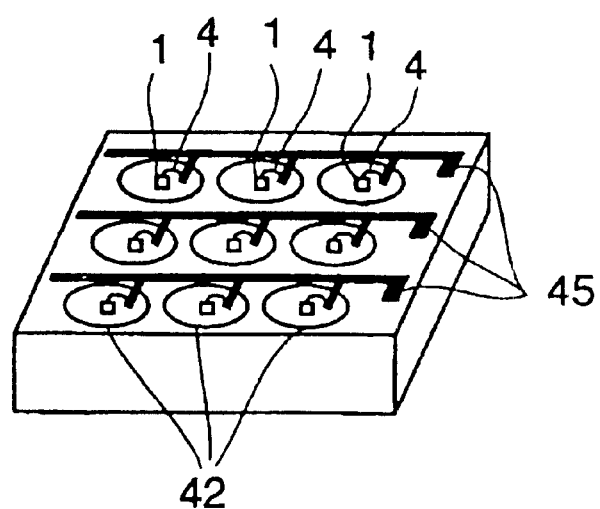
FIG. 22 shows a modification of the light emission device array of FIG. 20.

Finally upper and lower tie bars 38 and 39 in the lead frame array shown in FIG. 20 at (d) are separated, whereby an electrical circuit shown in FIG. 21 is provided by the separated light emission device array efficiently to energize many light emitter with a little components. Each light emission device is held by the light reflection member array of FIG. 20 at (f) as shown in FIG. 20 at (b) and the lead frame array of FIG. 20 at (d) as shown in FIG. 20 at (c), thereby providing rigid light emission device array.

As the thickness of the lead frame array shown in FIG. 20 at (d) is thickened, the rigidity of the light emission device array is strengthened, whereby the light emission device array may be mounted on a desired curve surface by curving or bending the lead frames. Thus, as described with respect to FIGS. 6 and 7, the heat generated from the light emitter 1 reaches the base 12 and the light reflection member 5 connected with the array, thereby performing large cooling effect. Thus constructed array may easily provide isolated single unit of light emission device by separating each light emission device on the array.

Figure 23:
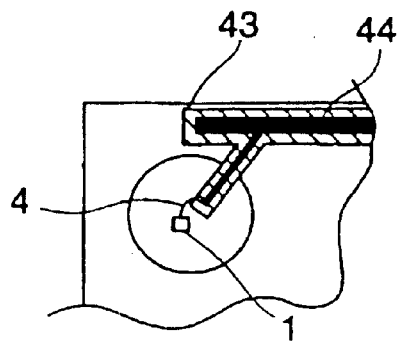
FIG. 23 shows an electric wiring pattern employed in the modified light emission device array of FIG. 22.

FIGS. 22 to 25 show a modification of the light emission device array of FIG. 20, in which light reflection portions 42 each provided with a concave having a curvature corresponding to the curvature of the light reflection member 5 are formed on a metal substrate 41 made of aluminum having high thermal conductivity. As shown in FIG. 23, an electric wiring film 44 is formed on the metal substrate 41 through an insulation film 43 disposed on the substrate as an electric wiring pattern 45 of FIG. 22. A light emitter 1 is die-bonded on a center of the light reflection member 42, and connected with the electric wiring film 44 by a bonding wire 4.

Figure 24:
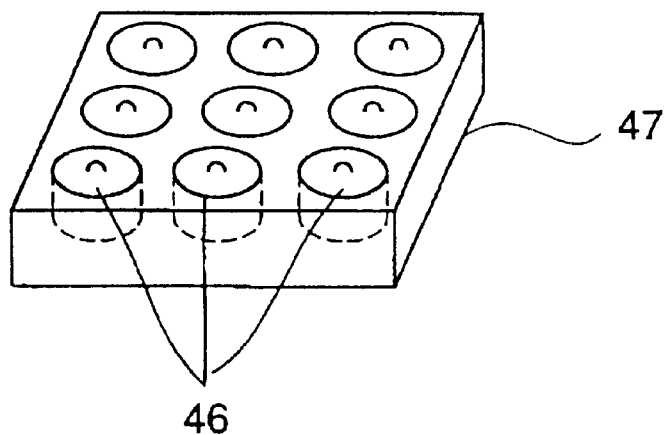
FIG. 24 shows resin mold forming lens portions of the array of FIG. 23.
Figure 25:
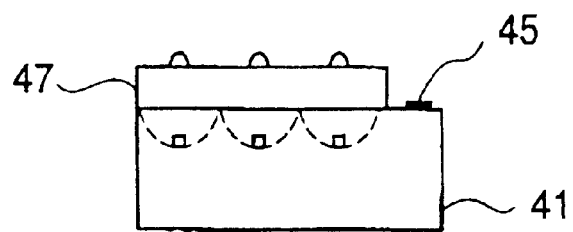
FIG. 25 shows the resin mold of FIG. 24 put on a metal substrate to form mold resins.

In order to form a mold resin 6 having a direct emission region 7 and a total reflection region 6 for converging and totally reflecting light from the light emitter 1, there is prepared a resin mold 47 having a forming die 46 by die center distance the same as arrangement die center distance of the light reflection member 42 on the metal substrate 41 as shown in FIG. 24, and the resin mold 47 is mounted on the metal substrate 41 as shown in FIG. 25 to be injected by mold resin 6 to seal light emitter 1 and provide direct emission region 7 and total reflection region 8 corresponding to each light emitter 1.

Thus, the heat from the light emitter 1 is spread over the metal substrate 41 having a large volume to be effectively radiated, in the same manner as what described in the fifteenth embodiment employing the cylindrical metal member 35 as shown in FIG. 18. According to this modification, it is possible to energize many light emission sources with a little component.

Figure 26:
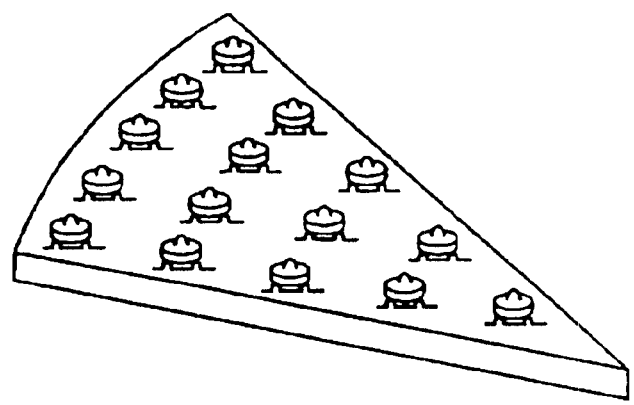
FIG. 26 shows another modification of the light emission device of FIG. 20.
Figure 27:
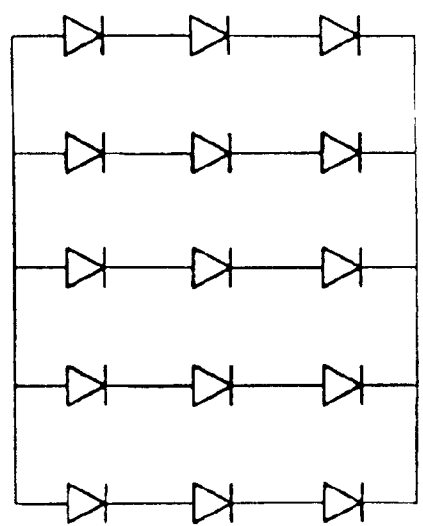
FIG. 27 shows an electric wiring pattern employed in the modified light emission device array of FIG. 26.
Figure 28:
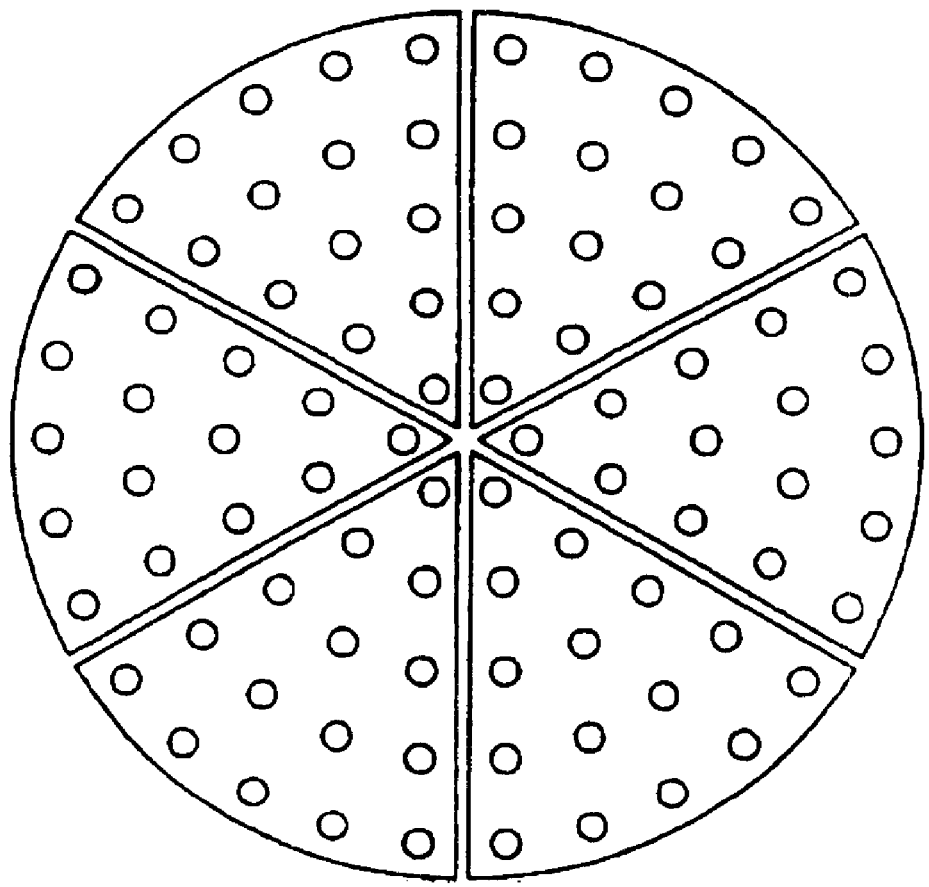
FIG. 28 shows a circle-shaped light source where the fan-shaped light emission device array of FIG. 26 is employed.

FIG. 26 shows another modification of the light emission device of FIG. 20, in which light emission devices employing the constructions in the fifth embodiment of FIGS. 5 and 7 are arranged in an array fashion as shown in FIG. 20. Light emission devices 48 as shown in FIGS. 5 and 7 are disposed one by one on a fan-shaped radiating plate 13 to provide an electric circuit shown in FIG. 27. As several thus fan-shaped modules are combined, a disk-shaped light source as shown in FIG. 28 is provided.

Figure 29:
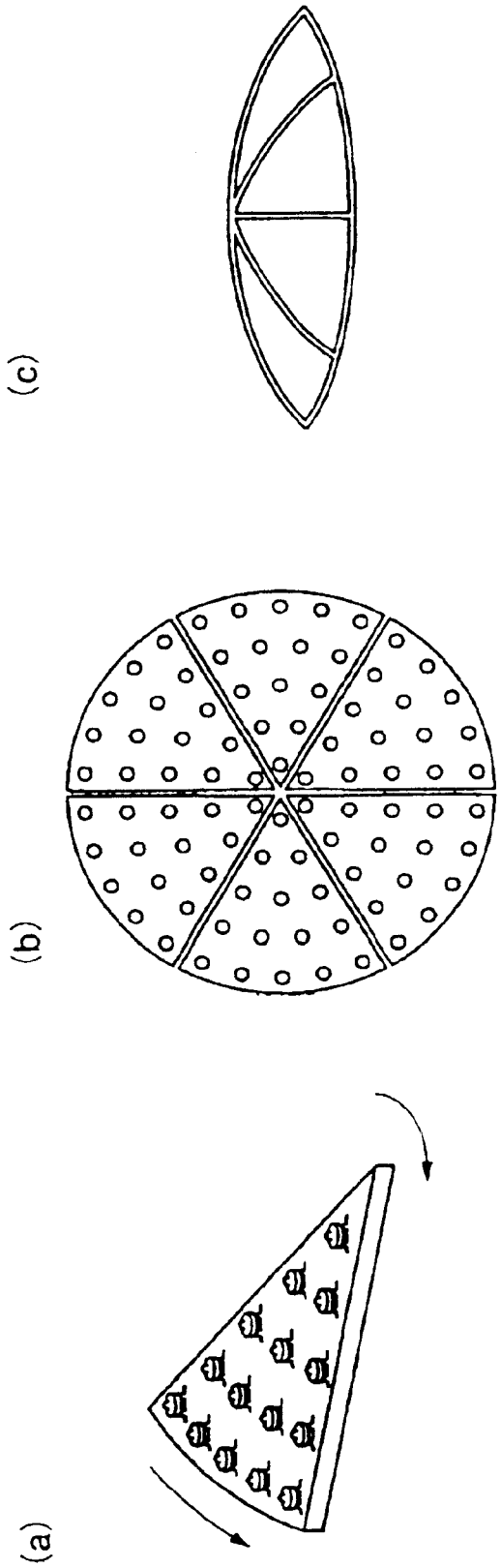
FIG. 29 shows another circle-shaped light source where the fan-shaped light emission device array of FIG. 26 is employed.
Figure 30:
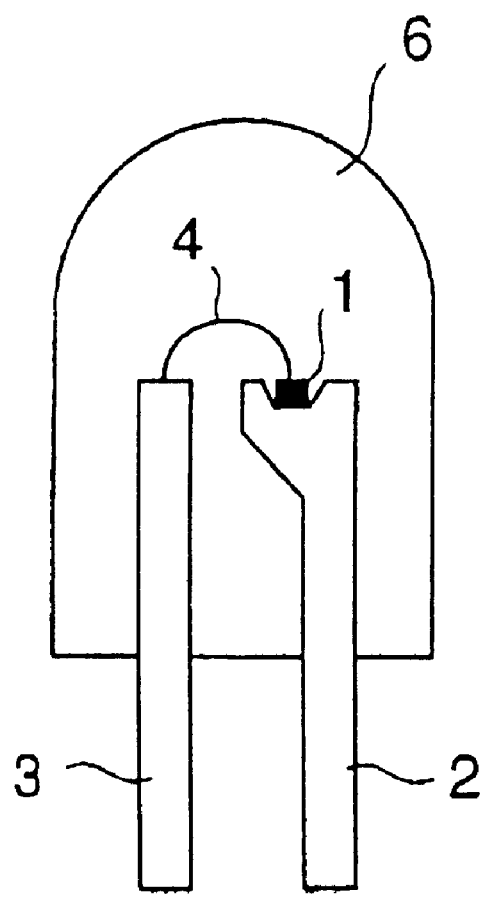
FIG. 30 shows a schematic side view of a conventional light emission device of a cannonball shape.

In addition, as each radiating plate 13 is thinned to be curved as shown by arrowed marks in FIG. 29 at (a) to be combined as shown in FIG. 29 at (b) for providing a circle-shaped light source of a curved shape having a center higher than edge by curving each fan-shaped array as shown in FIG. 29 at (c), there may be provided a light source having a wide directive angle and improved visualization. In FIGS. 26 and 29 one fan-shaped module is composed of fifteen light emission devices which are arranged in five lines, and in FIGS. 28 and 29 one circle-shaped light source is composed of six fan-shaped modules. The number of devices and modules is not limited by this invention, and any number of devices or modules may be employed.

The dimensions, materials, configurations, the relative arrangements of components described in the foregoing embodiments are only simple demonstrative examples rather than a purpose to limit the field of this invention as far as not particularly specified. Accordingly, while in the foregoing specification this invention has been described in relation to certain preferred embodiments thereof, and many details have been set forth for purpose of illustration, it will be apparent to those skilled in the art that the invention is susceptible to additional embodiments and that certain of the details described can be varied considerably without departing from the scope of this invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A light emission device comprising
   a light emitter,
   a light reflection member, and
   a resin sealing said light emitter by covering said light reflection member and said light emitter, in which light deviated from a predetermined front region in the light emitted from said light emitter is totally reflected by a boundary surface of said resin to be forwardly emitted by said light reflection member, and said emitter is thermally contacted with said reflection member to dissipate the heat generated from said light emitter.

2. A light emission device according to claim 1, in which said light emitter is mounted on a lead frame electrically connected with said light emitter and said lead frame is thermally contacted with said light reflection member so as to convey heat of said light emitter to said light reflection member from said lead frame for dissipation.

3. A light emission device comprising
   a light emitter,
   a light reflection member, and
   a resin sealing said light emitter by covering said light reflection member and said light emitter, in which light deviated from a predetermined front region in the light emitted from said light emitter is totally reflected by a boundary surface of said resin to be forwardly emitted by said light reflection member, said light emitter is mounted on a vertical plane body having a good thermal conductivity, and said vertical plane body is thermally connected with said light reflection member to dissipate heat of said light emitter through said vertical plane body and said light reflection member.

4. A light emission device according to claim 3, in which said vertical plane body is configured to have a dish portion on a center of said vertical plane body to be mounted by said light emitter, a groove for accommodating an insulator holding a lead frame, and a groove making the lead frame extending therethrough.

5. A light emission device comprising
   a light emitter,
   a light reflection member, and
   a resin sealing said light emitter by covering said light reflection member and said light emitter, in which light deviated from a predetermined front region in the light emitted from said light emitter is totally reflected by a boundary surface of said resin to be forwardly emitted by said light reflection member, and said light reflection member is formed with a lead frame as a single unit to dissipate heat of said light emitter mounted on said lead frame through said light reflection member.

6. A light emission device comprising
   an optical member having a light reflection member and a resin covering said light reflection member, and
   a light emitter of a surface mount type mounted on a metal plate, in which said resin is so constructed to direct light deviating from a predetermined front region about the light emitted from said light emitter to be almost totally reflected at a boundary surface of said resin for forward emission by said light reflection member, and said light reflection member is thermally contacted with said metal plate to dissipate heat of said light emitter.

7. A light emission device comprising
   a plurality of light reflection portions formed on a metal member in an array fashion,
   a plurality of light emitters each mounted near center of each of said light reflection portions to be die-bonded,
   a wiring pattern disposed on a surface of said metal member through an insulation film to be connected with each of said light emitters, and
   resins covering said light emitters above said light reflection portions, in which each of said resins is formed to direct light deviating from a predetermined front region about the light emitted from each of said light emitters to be almost totally reflected at a boundary surface of said resin for forward emission by each of said light reflection portions, and heat generated from each of said light emitters is dissipated by said metal member.

8. A light emission device according to claim 1, in which a non reflection surface of said light reflection member is exposed to air directly or through a thinned resin layer for thermal dissipation.

9. A light emission device according to claim 1, in which a peripheral edge of said light reflection member covers a part or all portion of said resin.

* * * * *